US012100453B2

(12) United States Patent
Sandhu et al.

(10) Patent No.: US 12,100,453 B2
(45) Date of Patent: Sep. 24, 2024

(54) METHOD AND APPARATUS FOR ANALOG FLOATING GATE MEMORY CELL

(71) Applicant: Nuvoton Technology Corporation, Taiwan (CN)

(72) Inventors: Bal S. Sandhu, Fremont, CA (US); Paul Vande Voorde, San Mateo, CA (US); Chang-Xian Wu, San Jose, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 390 days.

(21) Appl. No.: 17/498,686

(22) Filed: Oct. 11, 2021

(65) Prior Publication Data

US 2023/0116512 A1    Apr. 13, 2023

(51) Int. Cl.
| | |
|---|---|
| *H01L 23/522* | (2006.01) |
| *G11C 11/56* | (2006.01) |
| *G11C 16/04* | (2006.01) |
| *G11C 27/00* | (2006.01) |
| *H10B 41/30* | (2023.01) |

(52) U.S. Cl.
CPC ........ *G11C 16/045* (2013.01); *G11C 11/5635* (2013.01); *G11C 27/005* (2013.01); *H01L 23/5223* (2013.01); *H10B 41/30* (2023.02)

(58) Field of Classification Search
CPC . G11C 16/045; G11C 11/5635; G11C 27/005; G11C 16/0441; G11C 16/10; G11C 16/30; H01L 23/5223; H01L 29/40114; H01L 29/7885; H10B 41/30; H10B 41/40
See application file for complete search history.

(56) References Cited

U.S. PATENT DOCUMENTS

| | | | | | |
|---|---|---|---|---|---|
| 8,076,707 | B1* | 12/2011 | Hyde | ................ | H10B 41/10 257/314 |
| 2002/0114207 | A1* | 8/2002 | Takeuchi | ........... | G11C 16/3431 365/230.03 |
| 2003/0198087 | A1* | 10/2003 | Kinsey | ................ | H01L 29/7885 257/E27.103 |
| 2006/0291319 | A1* | 12/2006 | Pesavento | .............. | G11C 5/145 365/226 |
| 2007/0070707 | A1* | 3/2007 | Yamamoto | ............. | H10B 41/60 365/185.23 |
| 2008/0006868 | A1* | 1/2008 | Hsu | ........................ | H10B 69/00 257/314 |

(Continued)

*Primary Examiner* — Bitew A Dinke
(74) *Attorney, Agent, or Firm* — Kilpatrick Townsend & Stockton LLP

(57) ABSTRACT

A floating-node memory device includes a metal-oxide-semiconductor (MOS) transistor including a first polysilicon gate, a source region, and a drain region in a first well region, a tunneling device including a second polysilicon gate in a second well region, and a metal-insulator-metal (MIM) capacitor including a conductive top plate and a bottom plate formed in a metal interconnect layer. The floating-node device includes a floating-node comprising the first polysilicon gate, the second polysilicon gate, and the conductive top plate of the MIM capacitor coupled together, a control node at the bottom plate of the MIM capacitor, an erase node in the second well region, a source node at the source region of the MOS transistor, and a drain node at the drain region of the MOS transistor.

13 Claims, 9 Drawing Sheets

(56) References Cited

U.S. PATENT DOCUMENTS

| | | | | |
|---|---|---|---|---|
| 2008/0084743 A1* | 4/2008 | Grant | G11C 14/00 | |
| | | | 365/185.08 | |
| 2008/0205144 A1* | 8/2008 | Yamamoto | H10B 69/00 | |
| | | | 257/E27.103 | |
| 2008/0225601 A1* | 9/2008 | Ratnakumar | H10B 41/30 | |
| | | | 257/E27.103 | |
| 2009/0244971 A1* | 10/2009 | Lee | H10B 41/30 | |
| | | | 365/185.08 | |
| 2011/0234433 A1* | 9/2011 | Aruga | H03M 1/06 | |
| | | | 341/172 | |
| 2014/0104946 A1* | 4/2014 | Lee | G11C 5/141 | |
| | | | 365/185.08 | |
| 2014/0152379 A1* | 6/2014 | Fujimoto | H10B 43/40 | |
| | | | 257/532 | |
| 2015/0316503 A1* | 11/2015 | Hoque | H01L 29/78 | |
| | | | 257/253 | |
| 2018/0176493 A1* | 6/2018 | Spivak | H04N 25/75 | |
| 2021/0384204 A1* | 12/2021 | Cai | H10B 41/30 | |
| 2022/0059554 A1* | 2/2022 | Cai | H01L 29/66825 | |
| 2022/0165739 A1* | 5/2022 | Mun | H10B 41/30 | |
| 2023/0067884 A1* | 3/2023 | Müller | G11C 11/221 | |
| 2023/0111804 A1* | 4/2023 | Sandhu | G11C 16/30 | |
| | | | 257/315 | |

* cited by examiner

METHOD AND APPARATUS FOR ANALOG FLOATING GATE MEMORY CELL

CROSS-REFERENCES TO RELATED APPLICATIONS

This application is related to co-pending U.S. patent application Ser. No. 17/498,694, entitled "Method And Apparatus For Programming Analog Floating-Gate Memory Cell," concurrently filed, commonly assigned, incorporated by reference herein for all purposes

BACKGROUND OF THE INVENTION

The invention relates to the field of electronic circuits. More particularly, embodiments of the present invention are directed to non-volatile memories. Some embodiments described herein are applied to an analog non-volatile memory cell device and methods. However, the device and methods described here can also be used in applications which involve storing digital information in embedded non-volatile memories.

Electrically erasable programmable read-only memory (EEPROM) devices and flash memory devices are nonvolatile memory devices that retain their stored data even when their power supplies are interrupted. Various memory cell structures of the nonvolatile memory devices have been proposed to improve their performance. A typical unit memory cell of the nonvolatile memory devices employs a stack gate structure including a floating gate, an inter-gate dielectric layer and a control gate which are sequentially stacked on a semiconductor substrate.

As electronic systems improve with the development of fabrication techniques of semiconductor devices, complex integrated circuits become more prevalent, and often include embedded non-volatile memories. An embedded non-volatile memory is a small-sized memory built in an integrated circuit, such as microcontrollers, system-on-chip (SOC), and other integrated circuits, for the purpose of storing data. An embedded non-volatile memory can be used to store data for system information update, data encryption, programming, circuit parameter trimming, identification, and redundancy purposes, etc. Recently, floating-gate devices have found new applications into analog memories, analog and digital circuit elements, and adaptive processing elements.

Even though embedded non-volatile memories are in wide use, conventional embedded non-volatile memories often suffer from many drawbacks. For example, conventional embedded non-volatile memories often require complicated fabrication processes and provide limited data storage capabilities in the memories cells.

Therefore, improved methods and systems that address some of the limitations described above are desired.

BRIEF SUMMARY OF THE INVENTION

Embodiments of the present invention provide a floating-node non-volatile memory device and methods. In some embodiments, the memory cell includes a metal-oxide-semiconductor (MOS) transistor, a tunneling device, and a metal-insulator-metal (MIM) capacitor. The floating node is made up of a first floating gate in the MOS transistor, a second floating gate in the tunneling device, and a top plate of the MIM capacitor. Some embodiments provide circuits for interfacing to an external programmable voltage source for operating the device. The device structure, method for fabricating the device, and methods for operating the device are described.

Many benefits are achieved by way of the present invention over conventional non-volatile techniques. For example, the present technique provides a simple manufacturing process that relies upon conventional process technology. In some embodiments, the method provides a fabrication process that is compatible with the standard CMOS process and standard options provided by commercial foundries. In some embodiments, the non-volatile device structure provides substantially greater charge storage capability. The large charge storage capability is useful in analog data processing applications, and is also useful in providing greater margins in memory cell operations. In some embodiments, using an external programmable voltage source can simplify the integrated circuit chip, and provide more flexibility in operating the device. Further, the high-voltage interface circuit can provide protection of devices from over-stressing. Depending upon the embodiment, one or more of these benefits may be achieved. These and other benefits will be described in more detail throughout the present specification and more particularly below.

According to some embodiments of the present invention, a floating-node memory device, includes a p-type metal-oxide-semiconductor (PMOS) transistor including a first polysilicon gate over a gate oxide over a first N-well region; a tunneling device including a second polysilicon gate over a tunneling oxide over a second N-well region; and a metal-insulator-metal (MIM) capacitor including a conductive top plate and a bottom plate that is part of an (N−1)st layer metal interconnect, where N is an integer greater than or equal to 3. The first polysilicon gate, the second polysilicon gate, and the conductive top plate of the MIM capacitor are coupled together through a portion of an Nst layer metal interconnect to form a floating node of the memory device. The memory device is configured to be programmed by hot-electron injection in the PMOS transistor and erased by tunneling in the tunneling device, with the bottom plate of the MIM capacitor as a control gate.

According to some embodiments of the present invention, a floating-node memory device includes a metal-oxide-semiconductor (MOS) transistor including a first polysilicon gate, a source region, and a drain region in a first well region; a tunneling device including a second polysilicon gate in a second well region; and a metal-insulator-metal (MIM) capacitor including a conductive top plate and a bottom plate formed in a metal interconnect layer. The floating-node device includes a floating-node comprising the first polysilicon gate, the second polysilicon gate, and the conductive top plate of the MIM capacitor coupled together; a control node at the bottom plate of the MIM capacitor; an erase node in the second well region; a source node at the source region of the MOS transistor; and a drain node at the drain region of the MOS transistor.

According to some embodiments of the present invention, a method for forming a floating-node memory cell includes forming a first N-well region and a second N-well region in a P-type substrate, forming P-type source and drain regions and N-type contact regions in the first N-well region, and forming N-type contact regions in the second N-well region. The method also includes depositing a polysilicon layer over the gate oxide layer, and patterning the polysilicon layer to form a first polysilicon gate in the first N-well region and a second polysilicon gate in the second N-well region. The method further forms interconnect structures including N layers of metal interconnects, where N is an integer greater than or equal to 3. The method further includes forming a bottom plate of a metal-insulator-metal (MIM) capacitor in an (N−1)st layer of metal interconnect, and forming a top plate of the MIM capacitor between the (N−1)st layer and an Nst layer of metal interconnect.

According to some embodiments of the present invention, a non-volatile memory device includes a floating-node memory cell that includes a P-type metal-oxide-semiconductor (PMOS) transistor having a first polysilicon gate, a tunneling device having a second polysilicon gate, and a metal-insulator-metal (MIM) capacitor including a conductive top plate and a bottom plate formed in a metal interconnect layer. The first polysilicon gate, the second polysilicon gate, and the conductive top plate of the MIM capacitor are coupled together to form a floating-node. The memory device also includes a high-voltage input node for coupling to a programmable high-voltage source, and a high-voltage switch circuit coupled to the high-voltage input node for providing a voltage signal for performing hot-electron programming of the first polysilicon gate in the PMOS transistor, and tunneling erase of the second polysilicon gate in the tunneling device.

According to some embodiments of the present invention, a non-volatile memory device includes a floating-node memory cell disposed in an integrated circuit (IC). The memory cell includes a floating-node, a control node, an erase node, a source node, and a drain node. The memory device also includes a high-voltage input node for coupling to an external programmable high-voltage source external to the IC. The memory device also includes a high-voltage switch circuit coupled to the high-voltage input node for providing a voltage signal for performing hot-electron programming of charges to the floating node and tunneling erase of charges from the floating node. The high-voltage switch circuit includes PMOS transistors M1, M2, M3, and M4, and NMOS transistors M5, M6, M7, M8, and M9. Transistors M1, M3, M5, M7, and M9 are coupled in series between the high-voltage input node and a ground node, with a drain node of M9 coupled to a source node of M9. Transistors M2, M4, M6, and M8 are coupled in series between the high-voltage input node and the ground node, a node between M4 and M6 providing a high-voltage signal to the memory device. Further, M1 and M2 are coupled to form a current mirror, a gate node of M3, M4, M5 and M6 are coupled to a power supply voltage, and a gate node of M7 and a gate node of M8 are coupled to a control signal and a complement of the control signal, respectively.

According to some embodiments of the present invention, a method for operating a non-volatile memory device includes providing a floating-node memory cell, which includes a P-type metal-oxide-semiconductor (PMOS) transistor having a first polysilicon gate, a tunneling device having a second polysilicon gate, and a metal-insulator-metal (MIM) capacitor including a conductive top plate and a bottom plate formed in a metal interconnect layer. The first polysilicon gate, the second polysilicon gate, and the conductive top plate of the MIM capacitor are coupled together to form a floating-node. The method includes coupling a programmable high-voltage source to a high-voltage input node, which is coupled to a high-voltage switch circuit for providing a high-voltage signal. The method also includes coupling an output of the high-voltage switch circuit to an erase node, ramping the programmable high-voltage source to a first high voltage in a first ramp time, and maintaining the first high voltage for a first duration to perform an erase operation. The method further includes coupling the output of the high-voltage switch circuit to a program node, ramping the programmable high-voltage source to a second high voltage in a second ramp time, and maintaining the second high voltage for a second duration to perform for a program operation.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description can be applicable to any one of the similar components having the same first reference label irrespective of the second reference label.

DETAILED DESCRIPTION OF THE INVENTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will convey the scope. Among other things, the features of the disclosure can be facilitated by methods, devices, and/or embodied in articles of commerce. The following detailed description is, therefore, not to be taken in a limiting sense.

Figure 1:
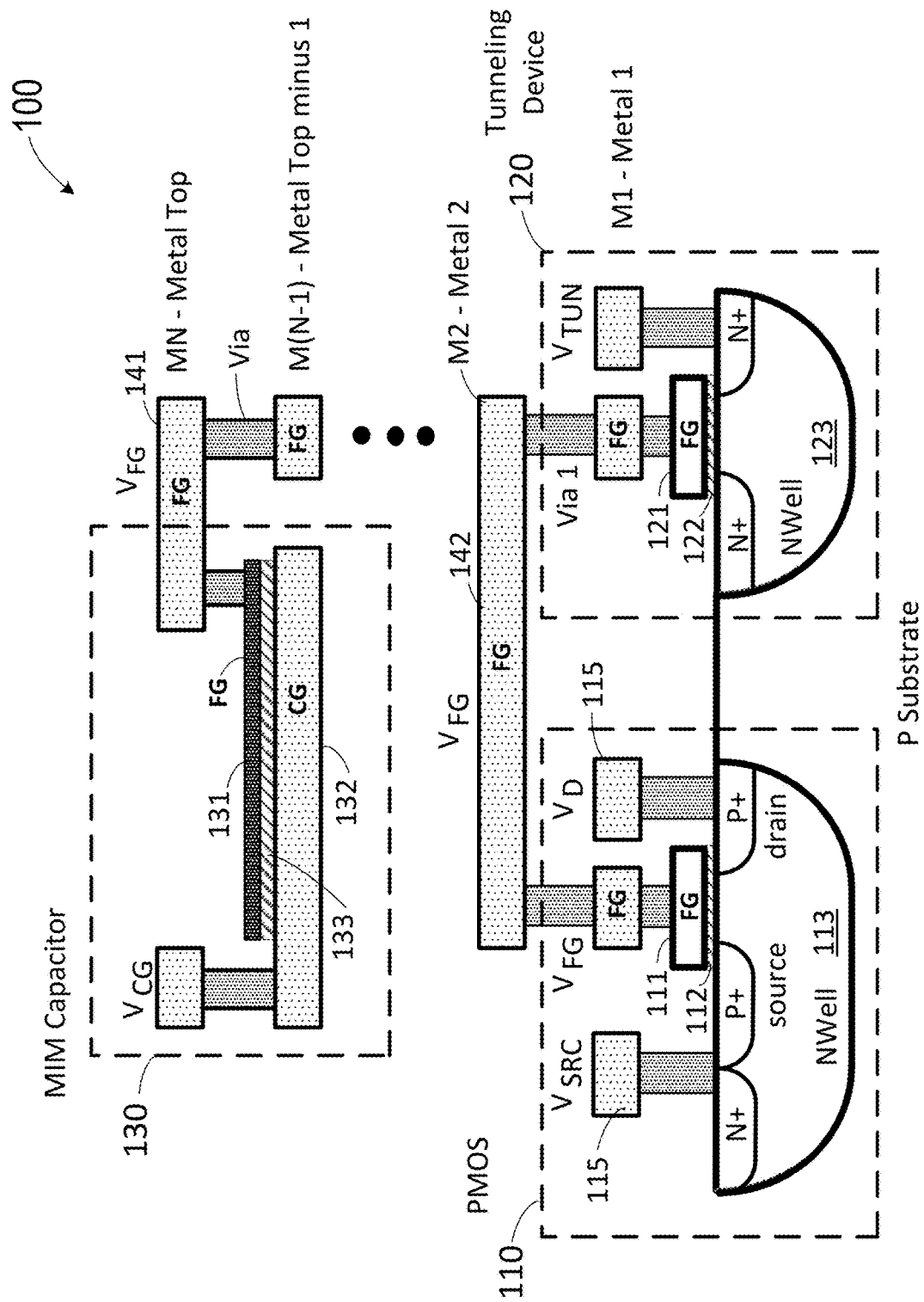
FIG. 1 is a simplified cross-sectional view of a floating-node memory device according to some embodiments.

FIG. 1 is a simplified cross-sectional view of a floating-node memory device according to some embodiments. As shown in FIG. 1, a floating-node memory device 100 is disposed in a p-type substrate, for example, a silicon substrate. The floating-node memory device 100 includes a P-type metal-oxide-semiconductor (PMOS) transistor 110 that includes a first polysilicon gate 111 over a gate oxide 112 over a first N-well region 113. Floating-node memory device 100 also includes a tunneling device 120 including a second polysilicon gate 121 over a tunneling oxide 122 over a second N-well region 123. Floating-node memory device 100 further includes a metal-insulator-metal (MIM) capacitor 130, which includes a conductive top plate 131 and a bottom plate 132 that is part of an (N−1)st layer metal interconnect M(N−1). As used herein, N is an integer greater than or equal to 3. A standard CMOS process is often characterized by the number of interconnect metal layers above the devices formed in the substrate and the polysilicon gate or interconnect layers. For example, an N-layer metal CMOS process includes a first layer metal M1, a second layer metal M2, . . . , and a top layer metal MN, where N is an integer. The layer of metal interconnect immediately below the top layer metal MN is often referred to as the top-minus-1 layer, or M(N−1).

In floating-node memory device 100, the first polysilicon gate 111, the second polysilicon gate 121, and the conductive top plate 131 of the MIM capacitor 130 are coupled together to form a floating node of the memory device 100. In FIG. 1, the floating node is designated with labels FG, and the voltage associated with the floating node is labeled $V_{FG}$. In the embodiment in FIG. 1, the first polysilicon gate 111, the second polysilicon gate 121, and the conductive top plate 131 of the MIM capacitor 130 are coupled together through a portion 141 of the $N^{st}$ layer metal interconnect MN to form the floating node of the memory device. The connection of the conductive top plate 131 of the MIM capacitor 130 to the polysilicon gates 111 and 121 also includes the first, second, . . . , and the $(N-1)^{st}$ layers of metal interconnect.

The memory device 100 in FIG. 1 is configured to be programmed by hot-electron injection in the PMOS transistor 110 and erased by tunneling in the tunneling device 120, with the bottom plate 132 of the MIM capacitor 130 as a control gate CG, with associated voltage $V_{CG}$.

In some embodiments, as shown in FIG. 1, the first polysilicon gate 111 and the second polysilicon gate 121 are connected by a second layer metal interconnect 142. In some embodiments, as shown in FIG. 1, the first polysilicon gate 111 and the second polysilicon gate 121 are connected by a first layer metal interconnect (not shown). In some embodiments, the floating-node memory device is characterized by a single polysilicon layer, and both the first polysilicon gate 111 and the second polysilicon gate 121 are formed in the single polysilicon layer. In this case, the first polysilicon gate is a first portion of the single polysilicon layer, and the second polysilicon gate is a second portion of the single polysilicon layer. In some cases, the first polysilicon gate 111 and the second polysilicon gate 121 are connected by a polysilicon line formed in the single polysilicon layer.

In some embodiments, the MIM capacitor 130 is disposed over the PMOS transistor 110 and the tunneling device 120. The MIM capacitor can be made as large as the combined area of the PMOS transistor 110 and the tunneling device 120 without increasing the size of the memory cell. In some embodiments, the MIM capacitor is characterized by an area that is 50% to 90% of an area of the floating-node memory device.

In some embodiments, the conductive top plate 131 of the MIM capacitor is made of a titanium nitride (TiN) material disposed between the $(N-1)^{st}$ layers of metal interconnect and the $N^{st}$ layers of metal interconnect. For example, in an embodiment, the CMOS process is a four-layer metal process with N=4. The conductive top plate 131 of the MIM capacitor is made of a titanium nitride (TiN) material disposed between the third layers of metal interconnect and the fourth layers of metal interconnect.

In some embodiments, the memory device described above can be fabricated using a standard single polysilicon CMOS process. The MIM capacitor is often offered as an option of a standard CMOS process by foundries. As described above, in some embodiments, the MIM capacitor is characterized by an area that is 50% to 90% of an area of the floating-node memory device. Therefore, the floating device described here can be fabricated using a simpler process and can provide substantially greater charge storage capacity than standard non-volatile memory technology, such as the Flash EEPROM process. In some embodiments, the tunneling oxide 122 and gate oxide 112 can be formed in the same gate oxide process, further simplifying the fabrication process.

Figure 2:
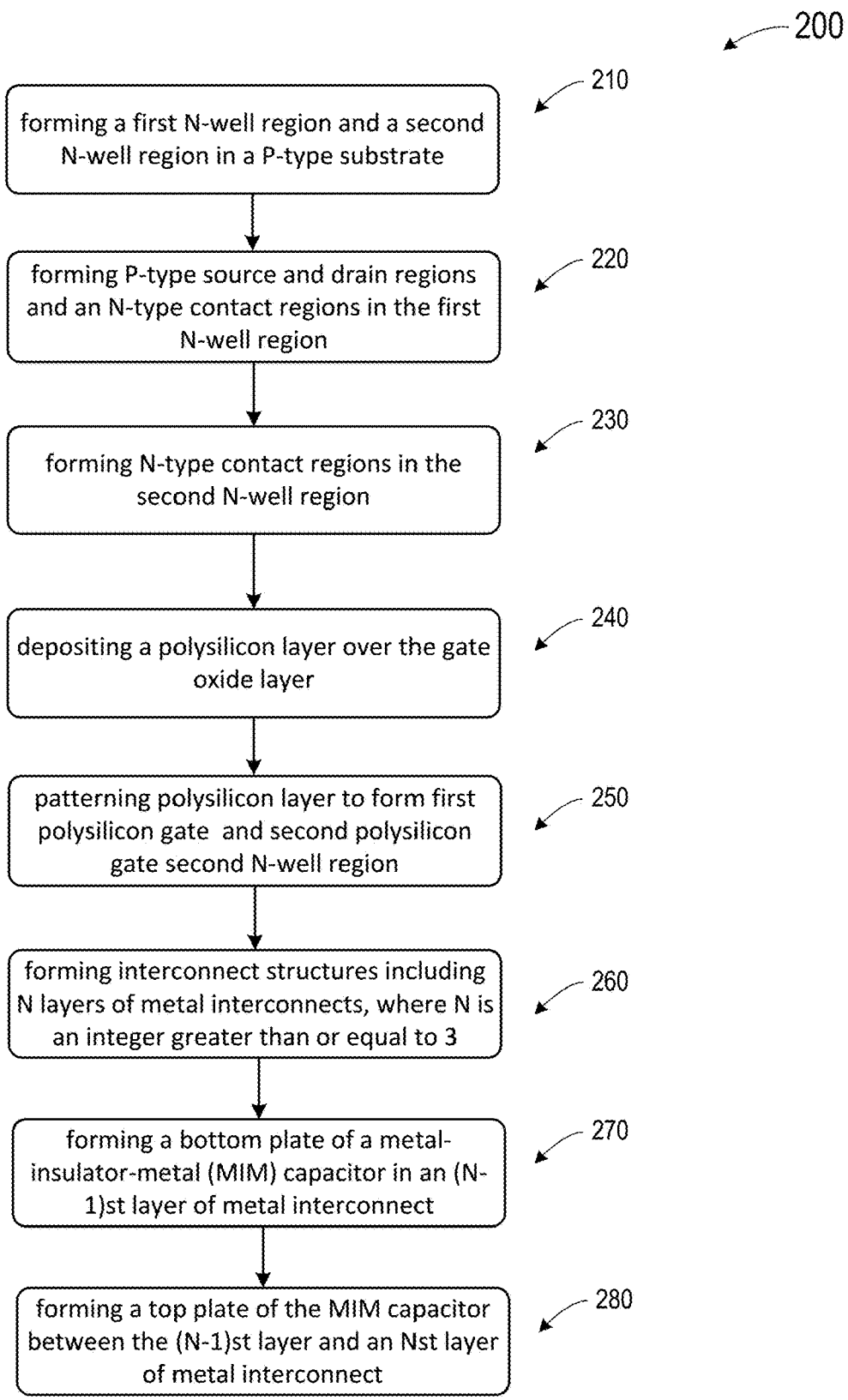
FIG. 2 is a simplified flowchart illustrating a method for forming a floating node memory cell according to some embodiments.

FIG. 2 is a simplified flowchart 200 illustrating a method for forming floating node memory cell according to some embodiments. As shown in FIG. 2, the method can be summarized as follows.

Process 210—forming a first N-well region and a second N-well region in a P-type substrate;

Process 220—forming P-type source and drain regions and N-type contact regions in the first N-well region;

Process 230—forming N-type contact regions in the second N-well region;

Process 240—depositing a polysilicon layer over the gate oxide layer;

Process 250—patterning the polysilicon layer to form a first polysilicon gate in the first N-well region and a second polysilicon gate in the second N-well region;

Process 260—forming interconnect structures including N layers of metal interconnects, where N is an integer greater than or equal to 3;

Process 270—forming a bottom plate of a metal-insulator-metal (MIM) capacitor in an (N−1)st layer of metal interconnect; and Process 280—forming a top plate of the MIM capacitor between the (N−1)st layer and an Nst layer of metal interconnect.

The above sequence of processes provides a method for forming a floating node memory cell according to an embodiment of the present invention. As shown, the method uses a combination of steps. Other alternatives can also be provided where steps are added, one or more steps are removed, or one or more steps are provided in a different sequence without departing from the scope of the claims herein. Further details of the present method can be found throughout the present specification and more particularly below.

In some embodiments, the method also includes forming a connection through the Nst layer of metal interconnect between the top plate of the MIM capacitor and the first polysilicon gate and a second polysilicon gate.

In some embodiments, the method also includes forming a connection between the first polysilicon gate and a second polysilicon gate in a second layer metal interconnect.

In some embodiments, the method also includes forming a connection between the first polysilicon gate and a second polysilicon gate in a first layer metal interconnect.

In some embodiments, the method also includes forming the top plate of the MIM capacitor using a titanium nitride (TiN) material.

In some embodiments, the method also includes forming P-type source and drain regions in the first N-well region for a p-type metal-oxide-semiconductor (PMOS) transistor.

In some embodiments, the method also includes forming an N-type contact region in the second N-well region for a tunneling device.

In some embodiments, the method also includes forming an N-type contact region in the second N-well region for a tunneling device as a tunneling node for the floating node memory cell.

Referring back to FIG. 1, the floating-node memory device 100 includes a floating-node FG comprising the first polysilicon gate 111, the second polysilicon gate 121, and the conductive top plate 131 of the MIM capacitor 130 coupled together, a control node CG at the bottom plate 132 of the MIM capacitor 130, an erase node 125 with a voltage $V_{TUN}$ in the second well region 123, a source node 115 at the source region of the PMOS transistor 110, and a drain node 116 at the drain region of the PMOS transistor 110. The memory device 100 is configured to be programmed by hot-electron injection in the MOS transistor and erased by tunneling in the tunneling device, with the bottom plate of the MIM capacitor as a control gate. More details are described below.

As shown in FIG. 1, the polysilicon gate 111 of the PMOS 110 is the floating node that connects to the charge storage capacitor and the tunneling device 120. In this example, the MOS tunneling device 120 is an N+ poly gate over an N-Well bottom plate. The charge storage capacitor is the Metal-Insulator-Metal (MIM) capacitor 130 that is formed in the metal layers of the CMOS process. The MIM capacitor is typically formed between the top metal layer and the metal layer below. For some processes, the MIM capacitor may be formed between lower adjacent metal layers. In some embodiments, the top plate 131 of MIM the is a thin metallic layer, for example, a TiN layer, deposited on top of a thin dielectric layer 133. For this case, the capacitor can cover the entire cell, providing more charge storage than the typical floating gate memory cell of the same size.

In FIG. 1, the source of the PMOS transistor 110, also referred to as PFET 110, is connected to a voltage $V_{SRC}$, the drain is connected to a voltage VD and the gate to the floating gate to a voltage $V_{FG}$. In FIG. 1, the bulk of the PFET 110 is also connected to $V_{SRC}$ in this embodiment. This is because the $V_{SRC}$ voltage can rise to 5V while, typically, the bulk of the PFET is normally connected to the VDDA which is much lower than $V_{SRC}$. Hence, if $V_{SRC}$>VBulk, the parasitic diode formed between the p+ junction on the source of the PFET and its N+ bulk region would become forward biased.

In some embodiments, to erase the floating node FG, the voltages on the $V_{SRC}$ and $V_{CG}$ are set to 0V and apply 7V on the $V_{TUN}$, which is the voltage on the tunneling node in the second N-well region 123. At the same time, the drain 115, is left floating. The electrons are pulled off the FG by Fowler-Nordheim tunneling, leaving behind a net positive charge on the FG capacitor. Typically, multiple cells can be erased at the same time. Normally, a memory is first erased to set the starting point of the cells. Then, only cells that need to be written to the opposite state need to be programmed.

In some embodiments, to write the FG cell, the voltage on the $V_{SRC}$ is set to 5V, $V_{CG}$ to 3.3V, and 0V on the $V_{TUN}$. At the same time, the drain 115, is left floating. Under these conditions, the high electric field between the $V_{SRC}$ and polysilicon gate 111 of PFET 110 induces hot-electron injection and electrons are pulled onto the polysilicon gate 111. This leaves a net negative charge on the floating-gate MIM capacitor, which includes all the capacitances associated with the components of the floating node as described above. Writing to the memory is typically on a Byte (8-bit) or Word (16-bit) basis. To write the cells, the data to be written is loaded into the data buffers and then applied to the memory cells being addressed. Assuming erased cells are logic "1", then only cells that need to be written to logic "0" are programed since the other cells are already in the correct state.

In some embodiments, to read the FG cell, the $V_{SRC}$ voltage is set to 2V, and $V_{TUN}$ and VCG set to 0V. A sense amplifier connected to the drain of PFET 110, is then used to compare the current of the PFET 110 with a reference current. The current of the PFET 110 is a function of the charge stored on the floating gate and is proportional to $(V_{FG}-V_{SRC})$–Vtp, where $V_{FG}$ is the voltage on the floating gate and Vtp is the threshold voltage of the pFET 110. If the $I_{CELL}$ current is greater than $I_{REF}$ of the sense amplifier, the Vout is a logic "1" and if $I_{CELL}$ current is less than $I_{REF}$ of the sense amplifier the Vout is a logic "0."

Figure 3:
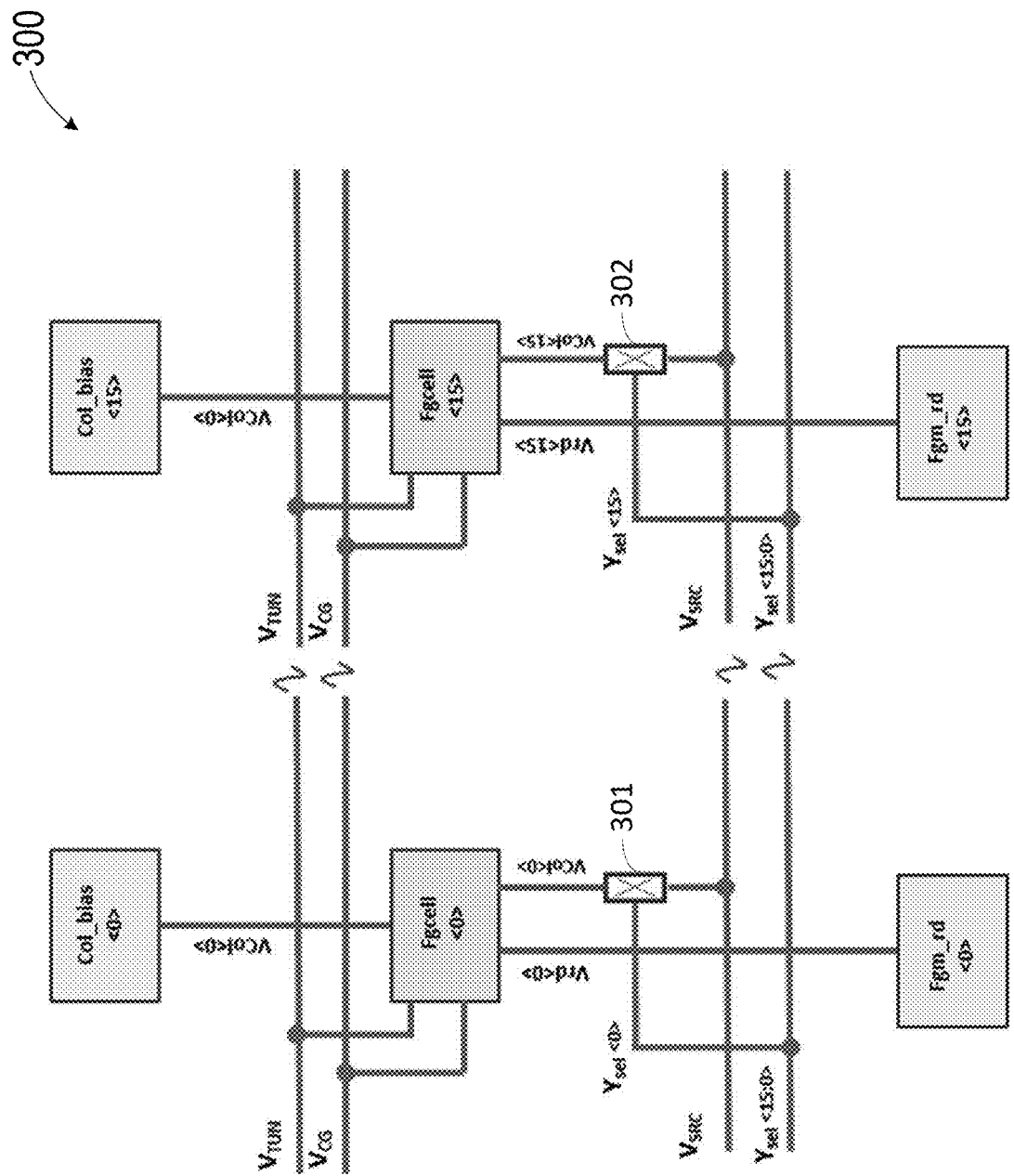
FIG. 3 is a simplified schematic diagram illustrating part of a nonvolatile memory array according to some embodiments.

FIG. 3 is a simplified schematic diagram illustrating part of a nonvolatile memory array according to some embodiments. For simplicity, this diagram only shows one row and two of sixteen columns, but this pattern can be repeated for n×m rows and columns to define the size of the memory array, where n and m are integers. The floating gate cell in column 1 is labeled Fgcell<0>, with associated column bias Col_bias<0>, column voltage Vcol<0>, drain voltage Vrd<0>, and read signal Fgm_rd<0>. Similarly, the floating gate cell in column 15 is labeled Fgcell<15>, with associated column bias Col_bias<15>, drain voltage Vrd<15>, column voltage Vcol<15>, and read signal Fgm_rd<15>. The common voltage lines are tunneling node voltage $V_{TUN}$, control node voltage VCG, and source node voltage $V_{SRC}$. FIG. 3 also shows a Y-decoder signal Ysel<15:0> to select 1 of 16 columns to connect to the $V_{SRC}$ line through multiplexers 301 and 302, respectively. Similarly, for row select, there would be an X-decoder to select 1 of n rows, which is not shown.

According to some embodiments, a method for operating a non-volatile memory device includes providing a floating-node memory cell, including a P-type metal-oxide-semiconductor (PMOS) transistor having a first polysilicon gate, a tunneling device having a second polysilicon gate, and a metal-insulator-metal (MIM) capacitor including a conductive top plate and a bottom plate formed in a metal interconnect layer. The first polysilicon gate, the second polysilicon gate, and the conductive top plate of the MIM capacitor are coupled together to form a floating-node. The method also includes coupling a programmable high-voltage source to a high-voltage input node, which is coupled to a high-voltage switch circuit for providing a high-voltage signal. The method also includes coupling an output of the high-voltage switch circuit to an erase node, ramping the programmable high-voltage source to a first high voltage in a first ramp time, and maintaining the first high voltage for a first duration to perform an erase operation. The method further includes coupling an output of the high-voltage switch circuit to a program node, ramping the programmable high-voltage source to a second high voltage in a second ramp time, and maintaining the second high voltage for a second duration to perform a program operation. More details are provided below with reference to FIGS. 4-9.

Figure 4:
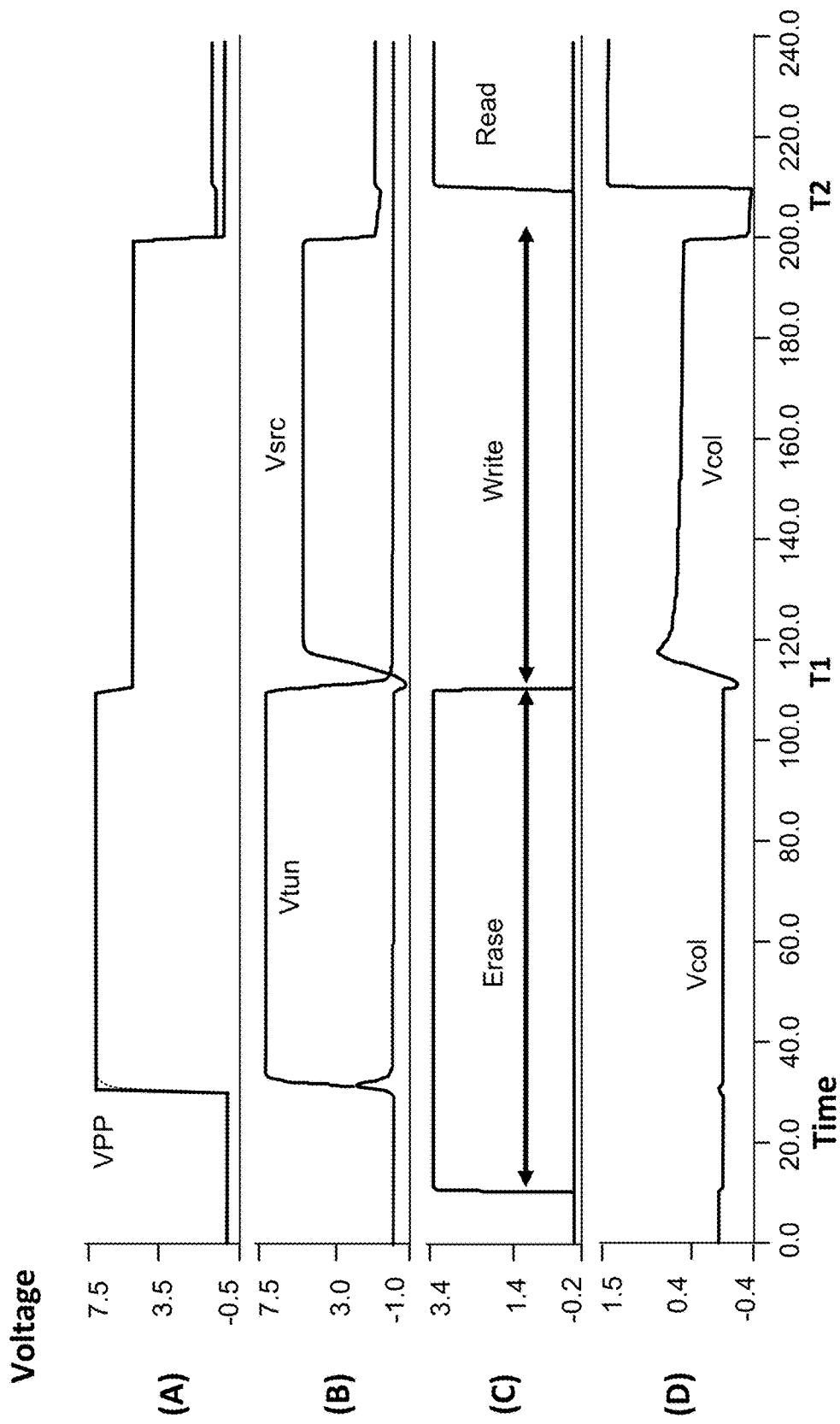
FIG. 4 and FIG. 5 are waveform diagrams illustrating simulated waveforms of signals for programming the memory array according to some embodiments.
Figure 5:
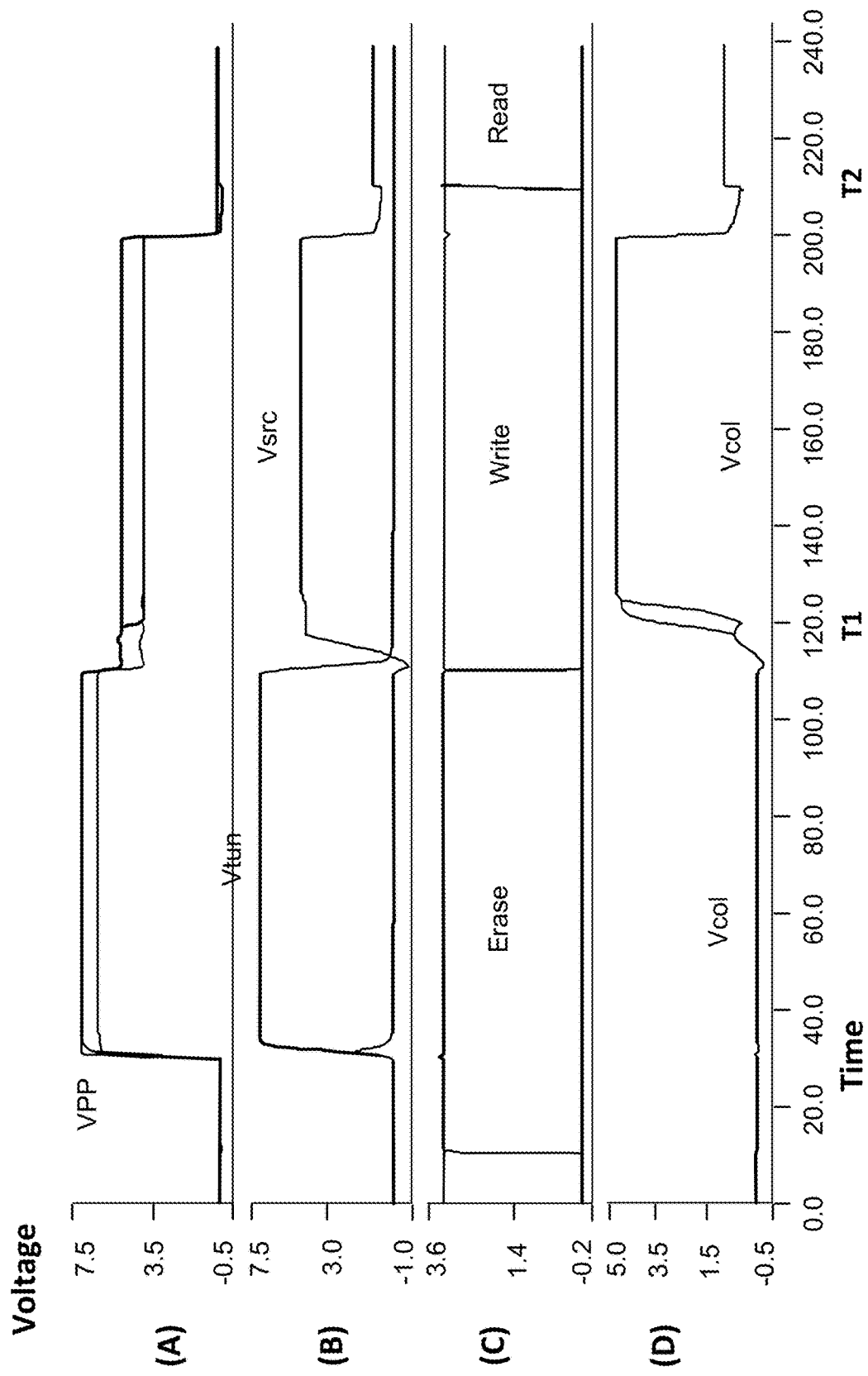

FIGS. 4 and 5 are waveform diagrams illustrating simulated waveforms of signals for programming the memory array according to some embodiments. In FIGS. 4 and 5, the horizontal axis is time, and the vertical axes show voltage waveforms for various signals. Waveform diagram (A) shows the waveform for a voltage VPP from an adjustable high-voltage line. Waveform diagram (B) shows the waveforms of the tunneling node voltage Vtun and the source node voltage $V_{SRC}$. Waveform diagram (C) shows the waveform for Erase, Write, and Read signals. Waveform diagram (D) is the waveform for the column select signal Vcol.

In some embodiments, the program sequence is as follows:
1. Start programming cycle
2. Enable program mode (erase or write)
3. Set control gate voltage VCG=$V_{SRC}$=0V
4. Enable Erase mode
5. Ramp VPP voltage to 7V in 1 ms
6. Keep VPP=7V for 1 mS (for erase)
7. At time T1, Disable Erase mode
8. Set Data for write
9. Select column address for write
10. Set control gate voltage VCG=3.3V
11. Ramp VPP=5V (=$V_{TUN}$)
12. Keep VPP=5V for 1 mS (for write)
13. Ramp VPP=0V in 1 mS(=$V_{SRC}$)
14. End programming cycle
15. At time T2, enter read mode In this example, the ramp time was chosen to be 1 mS, but this can be varied as required. The voltage on Vcol is determined by the data to be written. As shown in FIG. 4, if data=1, the Vcol voltage is <0.5V, and no hot-electron injection can occur. On the other hand, as shown in FIG. 5, if data=0, then Vcol=$V_{SRC}$=5V, and hot-electron injection can occur on the cells connected on that column.

The above sequence of processes provides a method for operating a non-volatile memory device according to an embodiment of the present invention. As shown, the method uses a combination of steps. Other alternatives can also be provided where steps are added, one or more steps are removed, or one or more steps are provided in a different sequence without departing from the scope of the claims herein. Further details of the present method can be found throughout the present specification.

Figure 6:
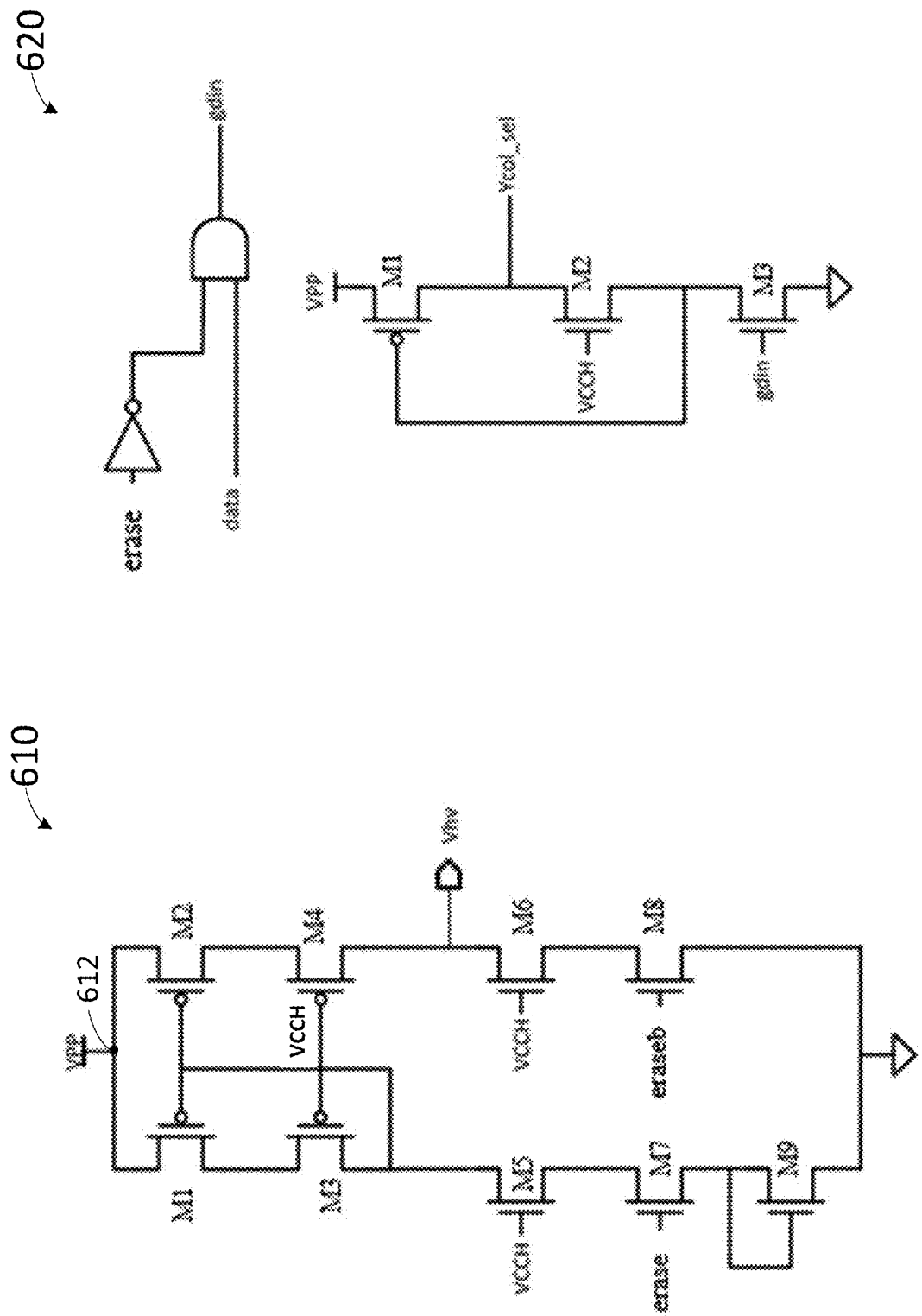
FIG. 6 is a schematic diagram illustrating a high-voltage (HV) transfer switch circuit according to some embodiments.

FIG. 6 is a schematic diagram illustrating a high-voltage (HV) transfer switch circuit according to some embodiments. A first HV switch circuit 610 is a VPP HV switch circuit, and is used to transfer the VPP high-voltage to the $V_{TUN}$ or $V_{SRC}$ for inducing either Fowler-Nordheim tunneling or hot-electron injection on the floating-gate. HV switch circuit 610 includes a high-voltage input node 612 for coupling to a high-voltage VPP from a programmable voltage source. In some embodiments, the high-voltage VPP is provided by an external programmable voltage source, for example, a tester, such as a memory tester.

HV switch circuit 610 includes transistors M1, M2, M3, M4, M5, M6, M7, M8, and M9, and voltage signals VPP, VCCH, erase, eraseb (erase bar, the complement of signal erase), and a high-voltage output signal Vhv. In HV switch circuit 610, when erase=1, eraseb=0, the transistor nFET M7 is ON and nFET M8 is OFF. The VPP voltage is transferred to the high-voltage output signal Vhv, which can be connected to $V_{TUN}$ or $V_{SRC}$.

The transistors M5 and M6 in HV switch circuit 610 limit the voltage on the drain of transistors M7 and M8 from being overstressed and keep their drain voltage limited to VCCH–$V_{TN}$, where VCCH is a supply voltage to the memory chip and, in an example, VCCH=3.3V, and $V_{TN}$ is the threshold of the nFET transistor. Similarly, the gate of transistors M3 and M4 is also connected to VCCH=3.3V to limit overstress of M1 and M2 when VHV follows VPP and goes to a high voltage ≥5V.

A second HV switch circuit 620 is a y-decoder select column switch and includes transistors M1, M2, and M3. In the erase mode, when the signal gdin=0, all ycol-sel lines will get VPP. This will block the y-select pass gate transferring $V_{SRC}$ to the columns. At the same time, the column gets pulled to 0V by the column bias circuits. The gdin signal is generated by a control logic circuit 630 with an AND gate receiving an input data signal and the erase signal through an inverter.

In HV switch circuit 620, the y-decoder select column switch, the high voltage VPP is transferred to the output in write mode depending on the data. The control logic 630, sets state of the output voltage signal, gdin. If the data=0, the AND gate output, gdin=0 and ycol_sel=VPP. If the data=1, then gdin=1 (erase=0 in write mode), and the ycol_sel is pulled low.

Figure 7:
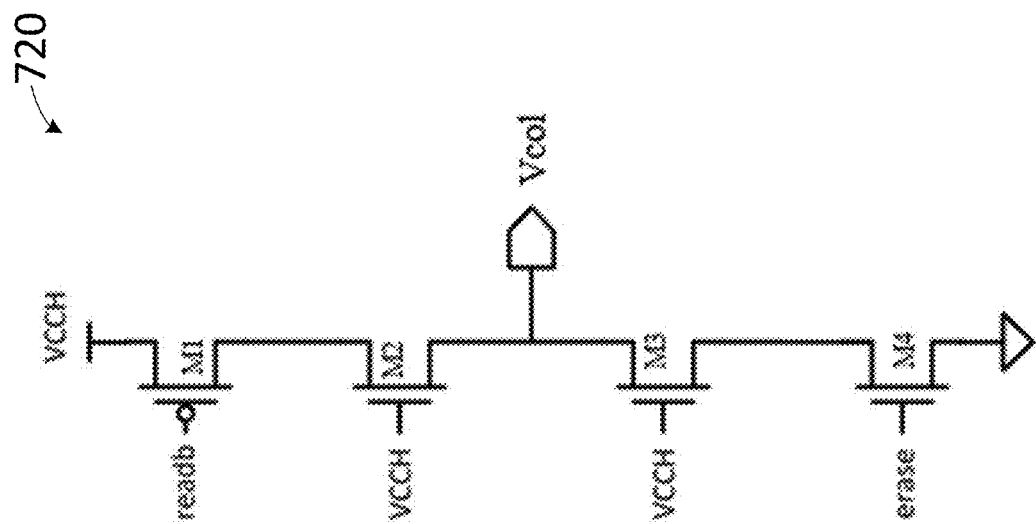
FIG. 7 is a schematic diagram illustrating a y-decoder column select pass transistor and a column bias circuit according to some embodiments.
Figure 7:
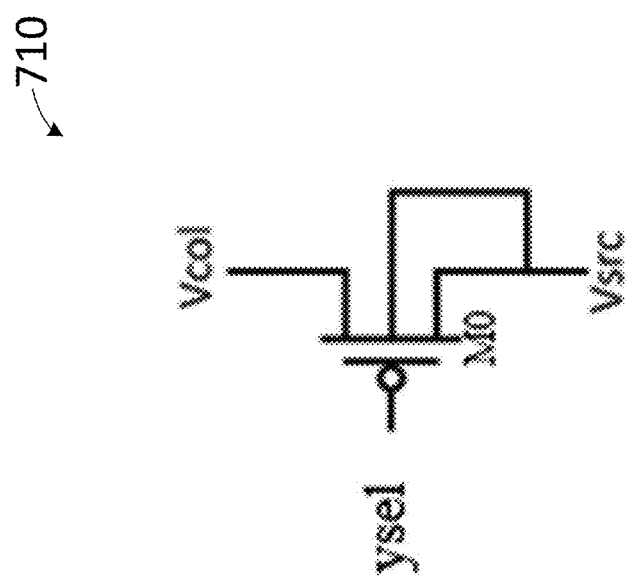

FIG. 7 is a schematic diagram illustrating a y-decoder column select pass transistor 710 and a column bias circuit 720 according to some embodiments. The y-sel column select transistor 710 includes a transistor M0 having a gate node receiving the ysel signal, a drain node coupled to the Vcol signal, a source node coupled to the $V_{SRC}$ signal, and a substrate node coupled to the source node $V_{SRC}$. The y-sel column select transistor 710 passes the $V_{SRC}$ voltage to the columns via the Vcol signal and to cells to be written via hot-electron injection by forcing the $V_{SRC}$ of the cell to 5V.

The column bias circuit 720 includes transistors M1, M2, M3, and M4 receiving signals readb, VCCH, VCCH, and erase, respectively. The column bias circuit 720 is used to force 0V on the column during the erase cycle (readb=1, erase=1) or 2V during read mode (readb=0, erase=0).

Figure 8:
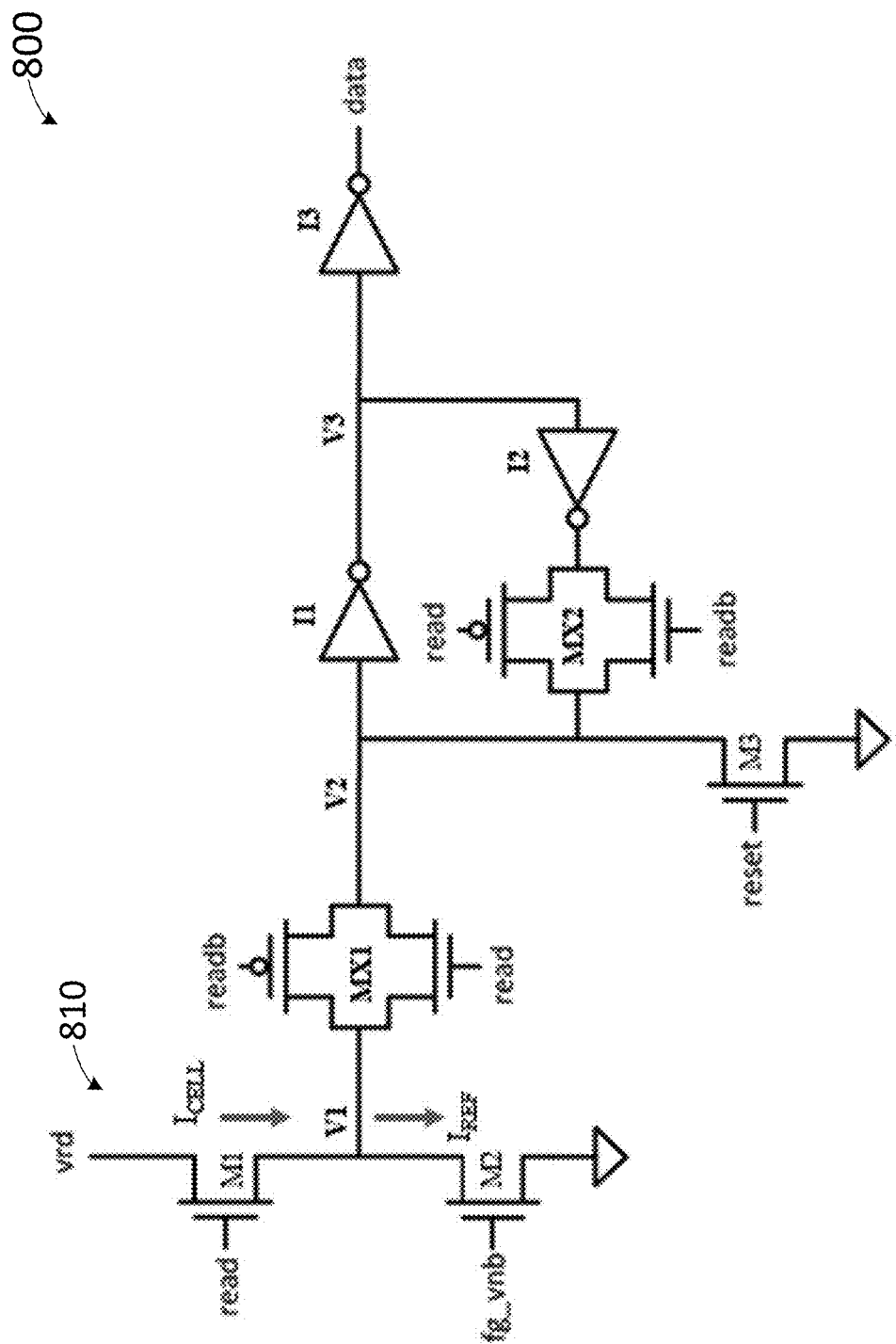
FIG. 8 is a simplified schematic diagram illustrating a sense amplifier read circuit according to some embodiments.

FIG. 8 is a simplified schematic diagram illustrating a sense amplifier read circuit according to some embodiments. As shown in FIG. 8, sense amplifier read circuit 800 includes a current comparator 810 formed by transistors M1 and M2, two pass gates (MX1, MX2), and three inverters (I1, I2, I3). The pass gate MX1 is ON in read mode and passes voltage V1 to the inverter I1, which drives the output buffer I3. The pass gate MX2 is OFF in the read mode. A reset signal is connected to transistor M3, and pulls down voltage on node V2 to 0V on chip power-up. The voltage on node V2 drives inverter I1. The inverter I1 drives the output buffer I3 and the feedback inverter I2. After the sense amplifier exits the read mode, the pass gate MX1 turns OFF, and pass gate MX2 turns ON and latches the data on node V2. The operation of the sense amplifier read circuit 800 is further explained with reference to the waveforms in FIG. 9.

Figure 9:
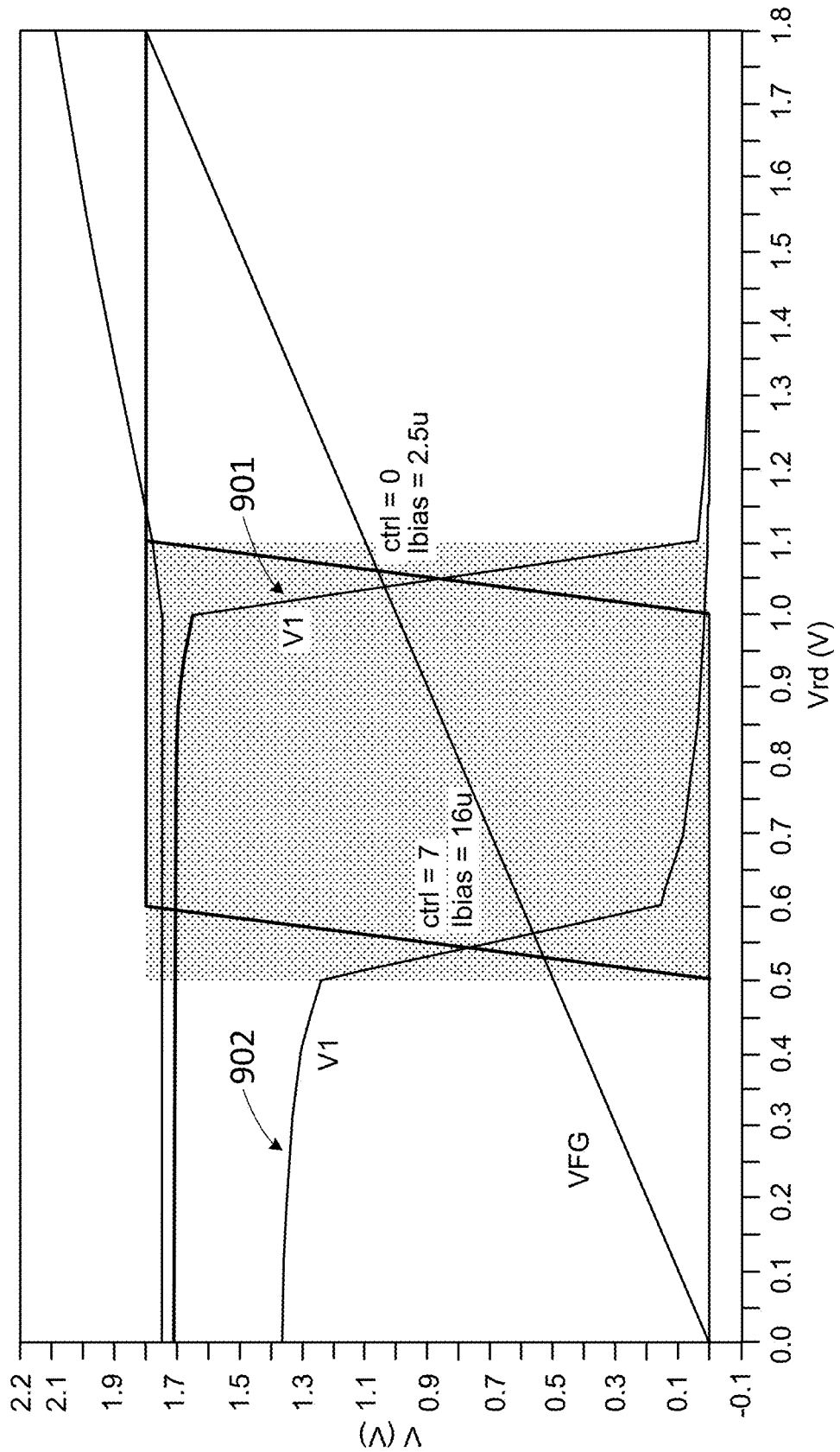
FIG. 9 is a waveform diagram illustrating simulated waveforms for signals associated with the current comparator 810 in the sense amplifier read circuit 800 in FIG. 8.

FIG. 9 is a waveform diagram illustrating simulated waveforms for signals associated with the current comparator 810 in the sense amplifier read circuit 800 in FIG. 8. In FIG. 9, the horizontal axis is read column voltage (Vrd), and the vertical axis is voltage for various signals. In read mode, the transistor M1 is on and connects the read column voltage (Vrd) to the sense amplifier. The gate of transistor M2 is connected to the output of a current mirror, which sets the sense amplifier reference current $I_{REF}$. This reference current can be adjusted from 2 uA to 16 uA in some embodiments. FIG. 9 shows two waveforms for V1: waveform 901 with Ibias at 2.5 uA (with signal ctrl=0) and waveform 902 for Ibias at 16 uA (with signal ctrl=7). This plot shows the sense amplifier trip-point vs. the voltage on the floating gate $V_{FG}$, which is swept from 0V to 1.8V.

The cell current $I_{CELL}$ is a function of the charge on the floating gate. This charge is converted to a voltage by virtue of the MIM capacitor on the floating gate. The sense amplifier subtracts the $I_{REF}$ current from the $I_{CELL}$ current. The output of the sense amplifier is then determined as follows:

If $I_{CELL}$>$I_{REF}$, V1="1" and hence, Vout="1"
If $I_{CELL}$<$I_{REF}$, V1="0" and hence, Vout="0"

The sense amplifier reads the state of the charge on the floating gate. If the cell was erased, there would be a net positive charge on the floating gate, and the $I_{CELL}$ current would be low; hence the sense amplifier output voltage Vout=0. If the cell was written, there would be a net negative charge on the floating gate, and the $I_{CELL}$ current would be high. Hence, the sense amplifier output voltage Vout=1.

As described above with reference to FIGS. 1-9, a non-volatile memory device includes one or more of floating-node memory cells. An example of the memory device is non-volatile memory device 300 in FIG. 3. An example of a floating-node memory cell is floating node memory device 100 in FIG. 1. As shown in FIG. 1, floating node device 100 includes a P-type metal-oxide-semiconductor (PMOS) transistor 110 having a first polysilicon gate 111, a tunneling device 120 having a second polysilicon gate 121, and a metal-insulator-metal (MIM) capacitor 130 including a conductive top plate 131 and a bottom plate 132 formed in a metal interconnect layer. The first polysilicon gate 111, the second polysilicon gate 121, and the conductive top plate 131 of the MIM capacitor are coupled together to form a floating-node FG. The non-volatile memory device 300 also includes a high-voltage input node for coupling to a programmable high-voltage source. As shown in FIG. 6, non-volatile memory device 300 also includes a high-voltage switch circuit 610 coupled to the high-voltage input node 612 for providing a voltage signal Vhv. Voltage signal Vhv is a high-voltage signal for performing hot-electron programming of the first polysilicon gate 111 in the PMOS transistor, and tunneling to erase, the second polysilicon gate 121 in the tunneling device 120.

In some embodiments, the memory device is disposed in an integrated circuit (IC), and the programmable high-voltage source is disposed external to the IC. For example, the programmable high-voltage source can be an external tester.

As mentioned previously, using an internal charge pump and ramp generator to control the VPP voltage rise/fall time and pulse-width (PW) is very costly in terms of chip area and power dissipation. Therefore, in some embodiments, an external tester is used to provide complete control of the VPP pulse. In order to reduce voltage overstress across the drain-gate interface of the pFET in the floating-gate transistor, it is desirable to drive the VPP high-voltage slowly (step/ramp) and keep it applied for a certain time (pulse-width) to allow charge transfer to occur, but prevent oxide damage. The VPP can either be (a) a test pin on the chip or simply (b) a metal pad that is not bonded out for wafer-level access. A dedicated test pin provides more flexibility to program the floating-gate memory at the package level. For case (b), a probe card can be used to perform the programming at the wafer level.

By using an external tester to drive the VPP pulse, a user can adjust the rise/fall time or the pulse width and find the best procedure to program the cells with good reliability. Since the pulse shape can be easily modified by a simple code change on the tester, it gives the user more flexibility to shape the VPP pulse for best programming results. The ramp on the VPP pulse is controlled by the external tester with either course or fine steps. In some embodiments, the VPP signal can be driven by a Chroma 3380P ATE tester with rise/fall/PW=2 mS. It is understood that other testers or external programmable voltage sources can also be used.

Certain embodiments have been described. However, various modifications to these embodiments are possible, and the principles presented herein may be applied to other embodiments as well. In addition, the various components and/or method steps/blocks may be implemented in arrangements other than those specifically disclosed without departing from the scope of the claims. Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. A non-volatile memory device, comprising:
a floating-node memory cell, including:
a P-type metal-oxide-semiconductor (PMOS) transistor having a first polysilicon gate;
a tunneling device having a second polysilicon gate; and
a metal-insulator-metal (MIM) capacitor including a conductive top plate and a bottom plate formed in a metal interconnect layer,
wherein the first polysilicon gate, the second polysilicon gate, and the conductive top plate of the MIM capacitor are coupled together to form a floating-node;
a high-voltage input node for coupling to a programmable high-voltage source;
a high-voltage switch circuit coupled to the high-voltage input node for providing a voltage signal for performing:
hot-electron programming of the first polysilicon gate in the PMOS transistor; and
tunneling erase of the second polysilicon gate in the tunneling device; and
wherein the high-voltage switch circuit comprises:
PMOS transistors M1, M2, M3, and M4;
NMOS transistors M5, M6, M7, M8, and M9;
wherein:
M1, M3, M5, M7, and M9 are coupled in series between the high-voltage input node and a ground node, a drain node of M9 coupled to a source node of M9;
M2, M4, M6, and M8 are coupled in series between the high-voltage input node and the ground node, a node between M4 and M6 providing a high-voltage signal to the memory device;
M1 and M2 are coupled to form a current mirror;
a gate node of M3 is coupled to a gate node of M4;
a gate node of M3 and gate node M4 is coupled to a power supply;
a gate node of M5 and a gate node of M6 are coupled to a power supply voltage;
a gate node of M7 and a gate node of M8 are coupled to a control signal and a complement of the control signal, respectively.

2. The memory device of claim 1, wherein the memory device is disposed in an integrated circuit (IC), and the programmable high-voltage source is disposed external to the IC.

3. The memory device of claim 1, wherein the power supply voltage is lower than the voltage at the high-voltage input node.

4. The memory device of claim 1, wherein the first polysilicon gate and the second polysilicon gate are connected by a second layer metal interconnect.

5. The memory device of claim 1, wherein the first polysilicon gate and the second polysilicon gate are connected by a first layer metal interconnect.

6. The memory device of claim 1, wherein the MIM capacitor is characterized by an area that is 50% to 90% of an area of the floating-node memory device.

7. A non-volatile memory device, comprising:
- a floating-node memory cell disposed in an integrated circuit (IC), including:
  - a floating-node;
  - a control node;
  - an erase node;
  - a source node; and
  - a drain node;
- a high-voltage input node for coupling to an external programmable high-voltage source external to the IC; and
- a high-voltage switch circuit coupled to the high-voltage input node for providing a voltage signal for performing:
  - hot-electron programming of charges to the floating node; and
  - tunneling erase of charges from the floating node;
- wherein the high-voltage switch circuit comprises:
  - PMOS transistors M1, M2, M3, and M4;
  - NMOS transistors M5, M6, M7, M8, and M9;
  - wherein:
    - M1, M3, M5, M7, and M9 are coupled in series between the high-voltage input node and a ground node, a drain node of M9 coupled to a source node of M9;
    - M2, M4, M6, and M8 are coupled in series between the high-voltage input node and the ground node, a node between M4 and M6 providing an high-voltage signal to the memory device;
    - M1 and M2 are coupled to form a current mirror;
    - a gate node of M3 is coupled to a gate node of M4;
    - a gate node of M3 and gate node M4 is coupled to a power supply;
    - a gate node of M5 and a gate node of M6 are coupled to a power supply voltage; and
    - a gate node of M7 and a gate node of M8 are coupled to a control signal and a complement of the control signal, respectively.

8. The memory device of claim 7, wherein the power supply voltage is lower than the voltage at the high-voltage input node.

9. The memory device of claim 7, wherein the floating-node memory cell, includes:
- a P-type metal-oxide-semiconductor (PMOS) transistor having a first polysilicon gate;
- a tunneling device having a second polysilicon gate; and
- a metal-insulator-metal (MIM) capacitor including a conductive top plate and a bottom plate formed in a metal interconnect layer,
- wherein the first polysilicon gate, the second polysilicon gate, and the conductive top plate of the MIM capacitor are coupled together to form the floating-node.

10. The memory device of claim 9, wherein the floating-node device comprises:
- a control node at the bottom plate of the MIM capacitor;
- an erase node at a well region of the tunneling device;
- a source node at a source region of the PMOS transistor; and
- a drain node at a drain region of the PMOS transistor.

11. The memory device of claim 9, wherein the first polysilicon gate and the second polysilicon gate are connected in the second layer metal interconnect.

12. The memory device of claim 9, wherein the first polysilicon gate and the second polysilicon gate are connected in the first layer metal interconnect.

13. The memory device of claim 9, wherein the MIM capacitor is disposed over the PMOS transistor and the tunneling device.

* * * * *